United States Patent [19]

Kawano et al.

[11] Patent Number: 5,281,827
[45] Date of Patent: Jan. 25, 1994

[54] CHARGED PARTICLE BEAM EXPOSURE APPARATUS

[75] Inventors: Masamichi Kawano, Mito; Masahide Okumura, Sagamihara; Haruo Yoda, Tokyo; Yukinobu Shibata, Ibaraki; Tadao Konishi, Mito, all of Japan

[73] Assignees: Hitachi, Ltd.; Hitachi Instrument Engineering Co., Ltd., both of Tokyo, Japan

[21] Appl. No.: 763,145

[22] Filed: Sep. 20, 1991

[30] Foreign Application Priority Data

Sep. 21, 1990 [JP] Japan .................. 2-250277

[51] Int. Cl.⁵ .......................... H01J 37/302
[52] U.S. Cl. ............................ 250/492.22
[58] Field of Search ............. 250/492.2, 492.22, 398

[56] References Cited

U.S. PATENT DOCUMENTS 4,261,762 4/1981 King ......................... 250/398
4,985,634 1/1991 Stengl et al. ............... 250/492.2

FOREIGN PATENT DOCUMENTS 57-204131 12/1982 Japan .
60-246131 12/1985 Japan .
61-9040 1/1986 Japan .

OTHER PUBLICATIONS

Chang et al., Electronics, vol. 50, No. 10, May 12, 1977, pp. 89-96.

Primary Examiner—Jack I. Berman
Attorney, Agent, or Firm—Antonelli, Terry, Stout & Kraus

[57] ABSTRACT

A column section is disposed within a thermostatic chamber within a clean room, a section for analog controlling each portion of the column section is disposed within the clean room and outside of the thermostatic chamber, and a section for digital controlling the analog control section is disposed outside of the clean room.

15 Claims, 2 Drawing Sheets

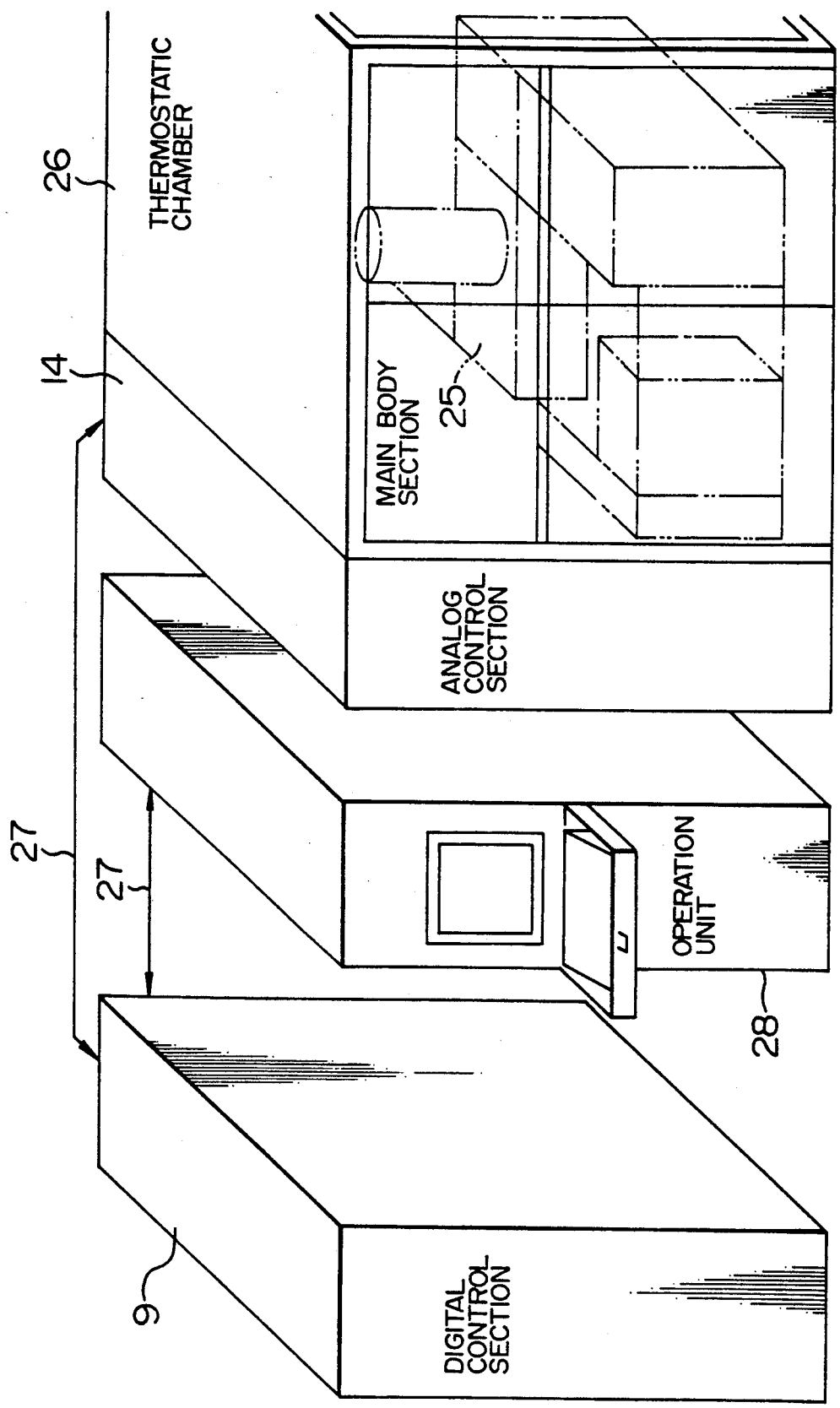

CHARGED PARTICLE BEAM EXPOSURE APPARATUS

BACKGROUND OF THE INVENTION

1. Field of the Invention

The present invention relates to a charged particle beam exposure apparatus, and particularly, to a charged particle beam exposure apparatus which is suitable for application to the manufacture of LSI's.

2. Description of the Related Art

There are two cases for the structure of a charged particle beam exposure apparatus, that is the case of integrating a main body of the apparatus including a charged particle generator section and a sample carrier section and a control unit for controlling these units and the case of separating the main body of the apparatus from the control unit. In the case of separating these units, it is general that the apparatus mechanism portion is separated from the control section. In this case, it is necessary to have an analog signal cable wired from the control section to the apparatus main body, with a maximum limit of about 10 m for the wiring distance between the two units. Further, in the case of integrating the apparatus main body and the control unit, an area for the installation of the apparatus is unnecessarily increased.

In order to minimize the necessary floor space within a clean room at the side of the user of the apparatus, it is desirable that only a portion requiring the stability of cleanness, temperature and humidity is installed within the clean room. From this viewpoint, having the charged particle beam exposure apparatus by integrating the main body of the apparatus and the control unit is a problem because it increases an unnecessary space for the floor area for the installation of the apparatus within the clean room. Further, in the case of separating the main body of the apparatus from the control unit to structure the charged particle beam exposure apparatus, there is a problem that the layout of the apparatus is constrained by the wiring of an analog signal cable.

As described above, there is a problem that constraints in the floor space and in the layout of the apparatus are applied to the user of the apparatus, because no consideration has been given either to reduce the floor space for the installation of the apparatus in the clean room or to guarantee the layout of the apparatus with high degree of freedom to match the idea of the configuration of the manufacturing line at the side of the user of the apparatus.

SUMMARY OF THE INVENTION

It is an object of the present invention to provide a charged particle beam exposure apparatus which is dividedly disposed within and outside the clean room so as to reduce the size of floor area required for the installation of the apparatus within the clean room and which is suitable for having a long distance for the divided installation of the apparatus.

According to one aspect of the present invention, a charged particle beam exposure apparatus is provided which comprises main body section including means for generating a charged particle beam, means for irradiating a sample with the charged particle beam, and means for controlling both the deflection of the charged particle beam and the irradiation of the sample with the charged particle beam; means for analog controlling the deflection and irradiation control means; and means for digital controlling the analog control means, the main body section and the analog control means being disposed within a clean room of a clean room area that comprises the clean room and a space under the floor thereof and the digital control means being disposed outside the clean room.

According to another aspect of the present invention, a charged particle beam exposure apparatus is provided which comprises a main body section including means for generating a charged particle beam, means for irradiating a sample with the charged particle beam and means for controlling both the deflection of the charged particle beam and the irradiation of the sample with the charged particle beam; means for analog controlling the deflection and irradiation control means; and means for digital controlling the analog control means, the main body section being disposed within a clean room of a clean room area comprising the clean room and a space under the floor therefor, the analog control means being disposed in the space under the floor and the digital control unit being disposed outside the clean room.

Other objects of the present invention and their characteristics will be clear from the following description to be made with reference to drawings.

BRIEF DESCRIPTION OF THE DRAWINGS

FIG. 2 is a perspective view of the apparatus shown in FIG. 1 according to one embodiment of the present invention.

DESCRIPTION OF THE PREFERRED EMBODIMENT

Figure 1:
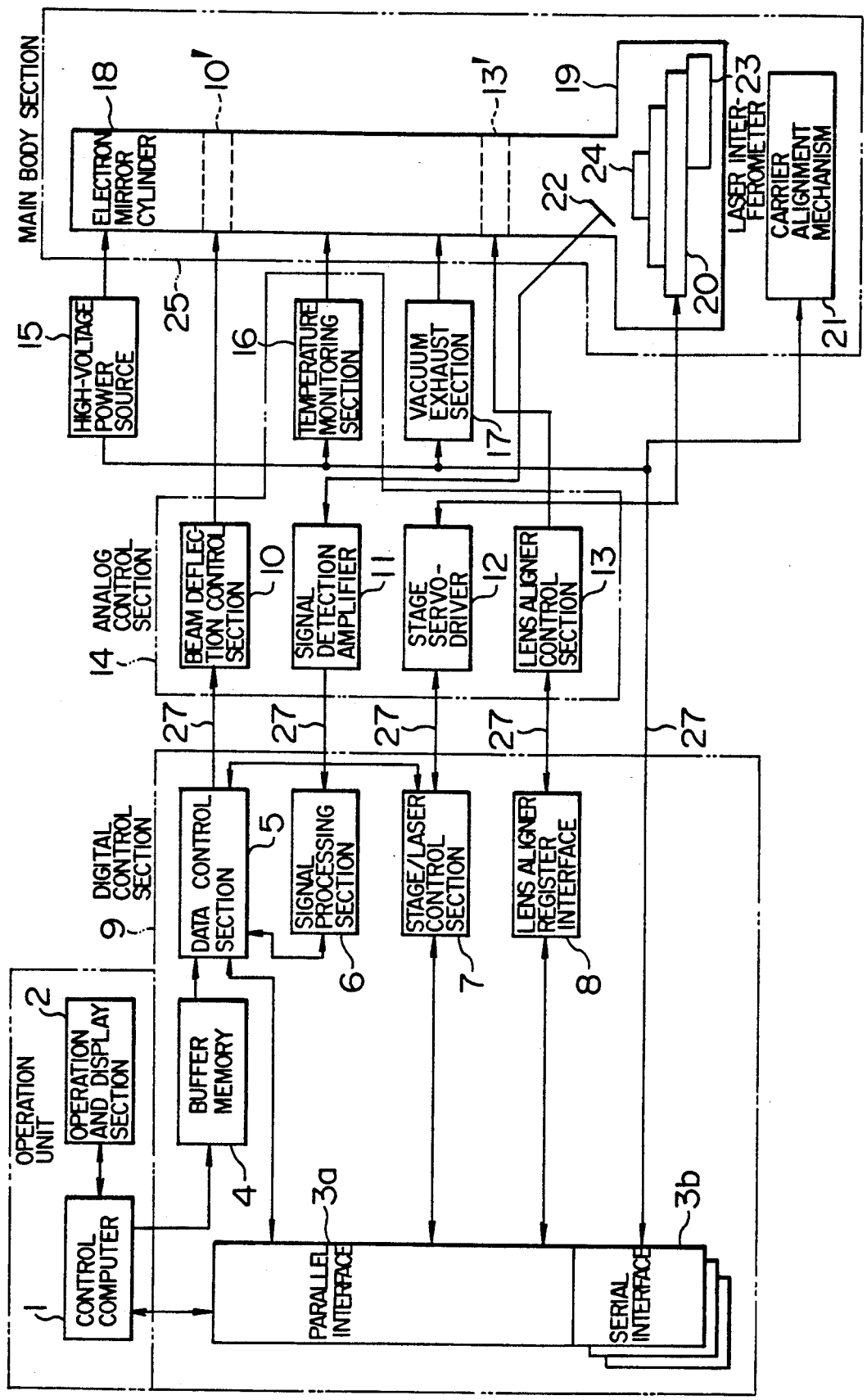
FIG. 1 is a block diagram of a charged particle beam exposure apparatus showing one embodiment according to the present invention.

Referring to FIG. 1, a control computer 1 generates data and instructions to each section of the apparatus in accordance with the input of an operation and display section 2. The control computer 1 transfers drawing data to a buffer memory 4 and then starts a data control section 5 through a parallel interface 3a. The data control section 5 sequentially reads the drawing data from the buffer memory 4, breaks down the drawing data into drawing data which enables a drawing to be formed by shooting electron beams, and then generates data for turning on or off data and beams for setting electron beams to a digital/analog converter which performs a deflection control. The data is then transferred to a beam deflection control section 10. The beam deflection control section 10 generates an analog signal for a beam deflection through the digital/analog converter and an amplifier by using data from the data control section 5.

A deflector and a blanker 10' for turning on and off a beam within an electron beam column 18 are controlled by the signal generated by the beam deflection control section 10, and a sample wafer 24 is irradiated with an electron beam which is discharged from an electron gun applied with a high voltage by a high-voltage power source 15.

In the case of drawing an LSI pattern by an exposure of an electron beam, it is general that the LSI pattern is drawn on the wafer 24 on which a drawing pattern has already been drawn. In order to accurately match expose a predetermined position of the wafer to the electron beam, it is necessary to grasp the relative positional relationship in X, Y and Z direction between the wafer and the electron beams by accurately detecting a reference mark on the wafer and the height of the wafer before drawing the LSI pattern. The reference mark on the wafer and the height of the wafer can be detected by utilizing an electron beam and light beam. A signal including information on these items is obtained from a detector 22, amplified by a signal detection amplifier 11, and processed to accurately extract positional information by a signal processing section 6. The information processed by the signal processing section 6 is read by the control computer 1 through a parallel interface 3a and is utilized to draw the LSI pattern by superposition. The signal processing section is started by a command of the control computer 1 despatched by the data control section 5.

Prior to drawing the LSI pattern, it is necessary to align the electron beams within the electron beam column 18 in the X, Y and Z directions. The data for alignment is set to a lens aligner control section 13 by the control computer 1 through the parallel interface 3a and a lens aligner register interface section 8. Based on the alignment data, the lens aligner control section 13 generates analog data for controlling the electron lens and an aligner 13' within the electron beam column 18 through the digital/analog converter and the amplifier.

A stage 20 for loading the wafer 24 on it is kept in vacuum in a sample chamber 19 and is moved together with the drawing, to make it possible to draw within a range covering an area larger than an electron beam deflection range. A stage position is measured by a laser interferometer 23. The control computer 1 executes starting of the stage and reading of a laser beam to a stage/laser control section 7 through the parallel interface 3a. The stage/laser control section 7 generates a stage operation pattern by referring to a stage position outputted from the laser interferometer 23. A stage servo-driver 12 generates an analog drive signal for controlling the motor from the stage operation pattern generated and servo-controls the stage.

Through a serial interface 3b, the control computer 1 controls a carrier/alignment mechanism section 21 such as a loader and the like for mounting and dismounting the wafer 24 to and from the stage, a vacuum exhaust section 17 for vacuum exhausting the electron beam column 18 and the sample chamber 19, the high-voltage power source 15 and a temperature monitoring section 16 for monitoring the temperature of each portion of the main body.

Data indicating the states of various portions such as the position of the stage, a current value (a set value) of the lens, the current position of the wafer, the open and close state of the vacuum valve, etc. are serially transferred to the operation and display section 2 and are displayed in this section.

In the above configuration, as shown in FIG. 1, the control computer 1 and the operation display section 2 are provided in one operation unit which can be divided, the parallel interface 3a, the serial interface 3b, the buffer memory 4, the data control section 5, the signal processing section 6, the stage/laser control section 7 and the lens aligner register interface 8 are grouped in a digital control section 9, and the beam deflection control section 10, the signal detection amplifier 11, the stage servo driver 12, the lens aligner control section 13 and the temperature monitoring section 16 are grouped in an analog control section 14. The high-voltage power source 15 and the vacuum exhaust section 17 belong to the main body, and the electron beam column 18, the sample chamber 19, the stage 20 the laser interferometer 23 and the carrier/alignment mechanism section 21 are set as a main body.

In this case, the control computer 1 and the digital control section 9, and the digital control section 9 and the analog control section 14 are connected with each other by a parallel or serial digital transmission path 27 respectively. Particularly, deflection data and beam blanking data are parallel transferred between the data control section 5 and the beam deflection control section 10 and the parallel transfer period can be varied in accordance with conditions for exposing the charged particle beams.

The digital transmission path 27 is provided by the combination of a current driver and a wire cable, or an optical fiber performing optical conversion, to enable a cable wiring with the distance of 50 m to 100 m.

An example of the loading of a standard apparatus is shown in FIG. 2.

The main body section 25 is accommodated in a thermostatic chamber 26 and the analog control section 14 is disposed adjacent to the main body. The thermostatic chamber 26 accommodating the main body section 25 and the analog control section 14 are disposed within a clean room. The digital control section 9 can take a free layout within the distance of 50 m to 100 m, for example in a space under the floor of the clean room or outside the clean room. The control computer 1 and the operation display section 2 are loaded in an operation unit 28. The operation unit 28 can also take a free layout within the distance of 50 m to 100 m. The operation unit can take any format of rack mount, disk top or disk side, and can be disposed in a desired format near the main body or within the clean room, to facilitate the use of the operation unit. By this arrangement, a flexible use of the operation unit is made possible to match the idea of the user of the apparatus.

According to the present embodiment, the operation unit 28 and the digital control section 9 can be disposed at the outside of the clean room within the distance of 50 m to 100 m so that the charged particle beam exposure apparatus can be disposed to meet the idea of the manufacturing line at the side of the user of the apparatus. Further, the digital control section and the operation and display section can be disposed at a remote place, so that the size of the area for installing the apparatus in the clean room can be reduced. Further, the digital control section and the deflector/control section are connected with a digital parallel transmission path, with the parallel transfer period being set to be variable in accordance with conditions for exposing the charged particle beams, so that the productivity can be improved and it becomes possible to draw LSI patterns with resists having various levels of photosensitive sensitivity.

It is needless to mention that the analog control section 14 can be disposed beneath the clean room if it is near the main body, so that the size of the floor area within the clean room can be reduced further.

We claim:

1. A charged particle beam exposure apparatus, comprising:
   a main body section including
      means for generating a charged particle beam,
      means for irradiating a sample with said charged particle beam, and means for controlling both deflection of said charged particle beam and irradiation of said sample with said charged particle beam;
means for analog controlling said deflection and irradiation control means;
means for digital controlling said analog control means; and
a digital transmission path connecting said analog control means to said digital control means;
said main body section and said analog control means being disposed within a clean room of a clean room area which comprises said clean room and a space under the floor thereof, and said digital control means being disposed outside of said clean room.

2. A charged particle beam exposure apparatus according to claim 1, further comprising means for transmitting data to said digital control means, said data transmitting means being disposed outside of said clean room area.

3. A charged particle beam exposure apparatus according to claim 2, wherein said digital control means is disposed outside of said clean room area.

4. A charged particle beam exposure apparatus according to claim 1, wherein said digital transmission path is a parallel digital transmission path.

5. A charged particle beam exposure apparatus according to claim 4, wherein a data transmission period for data to be transmitted through said parallel digital transmission path is variable.

6. A charged particle beam exposure apparatus, comprising:
a main body section including
means for generating a charged particle beam,
means for irradiating a sample with said charged particle beam, and
means for controlling both deflection of said charged particle beam and irradiation of said sample with said charged particle beam;
means for analog controlling said deflection and irradiation control means;
means for digital controlling said analog control means; and
a digital transmission path connecting said analog control means to said digital control means;
said main body section being disposed in a clean room of a clean room area which comprises said clean room and a space under the floor thereof, said analog control means being disposed in said space under the floor, and said digital control means being disposed outside of said clean room.

7. A charged particle beam exposure apparatus according to claim 6, further comprising means for transmitting data to said digital control means, said data transmitting means being disposed outside of said clean room area.

8. A charged particle beam exposure apparatus, comprising:
a main body section including
means for generating a charged particle beam,
means for irradiating a specimen with said charged particle beam, and
means for controlling both deflection of said charged particle beam and irradiation of said sample with said charged particle beam;
means for analog controlling said deflection and irradiation control means;
means for digital controlling said analog control means; and
a digital transmission path connecting said analog control means to said digital control means;
said main body section being disposed in a thermostatic chamber of a clean room area which comprises a clean room including said thermostatic chamber and a space under the floor thereof, said analog control means being disposed within said clean room and outside said thermostatic chamber, and said digital control means being disposed outside said clean room.

9. A charged particle beam exposure apparatus according to claim 8, further comprising means for transmitting data to said digital control means, said data transmitting means being disposed outside of said clean room area.

10. A charged particle beam exposure apparatus, comprising:
a main body section including
means for generating a charged particle beam,
means for irradiating a sample with said charged particle beam, and
means for controlling both deflection of said charged particle beam and irradiation of said sample with said charged particle beam;
means for analog controlling said deflection and irradiation control means;
means for digital controlling said analog control means; and
a digital transmission path connecting said analog control means to said digital control means;
said main body section being disposed in a thermostatic chamber of a clean room area which comprises a clean room including said thermostatic chamber and a space under the floor thereof, said analog control means being disposed within said clean room area, and said digital control means being disposed outside of said clean room.

11. A charged particle beam exposure apparatus according to claim 10, further comprising means for transmitting data to said digital control means, said data transmitting means being disposed either within said clean room and outside said thermostatic chamber or outside said clean room area.

12. A charged particle beam exposure apparatus, comprising:
a main body section including
means for generating a charged particle beam,
means for irradiating a sample with said charged particle beam,
means for controlling both deflection of said charged particle beam and irradiation of said sample with said charged particle beam, and
a sample stage for supporting said sample; an analog control section including
means for analog controlling said deflection and irradiation control means, and
means for analog controlling said sample stage;
a digital control section including means for digital controlling each of said analog control means;
a digital transmission path connecting said analog control section to said digital control section; and
an operation and display section for transmitting data to said digital control section and for displaying data which shows states of said sample irradiation means and said sample stage;
said main body section being disposed in a thermostatic chamber of a clean room area which comprises a clean room including said thermostatic chamber and a space under the floor thereof, said analog control section being disposed within said clean room and outside said thermostatic chamber, said digital control section being disposed outside said clean room, and said operation and display section being disposed outside said clean room area.

13. A charged particle beam exposure apparatus according to claim 12, wherein parallel data transmission is carried out over said digital transmission path between said means for analog controlling said deflection and irradiation control means in said analog control section and said digital control section, and said data which shows states of said sample irradiation means and said sample stage is serially transmitted from said analog control section to said operation and display section.

14. A charged particle beam exposure apparatus according to claim 13, wherein a period for said parallel data transmission is variable.

15. A charged particle beam exposure apparatus according to claim 10, wherein said main body section further includes a sample stage for supporting said sample, and an operation and display section for transmitting data to said digital control means and for displaying data showing states of said sample irradiation means and said sample stage, said operation and display section being disposed within said clean room and outside said thermostatic chamber.

* * * * *